US009834745B2

(12) United States Patent
Sassa et al.

(10) Patent No.: US 9,834,745 B2
(45) Date of Patent: Dec. 5, 2017

(54) CLEANING FLUID FOR SEMICONDUCTOR, AND CLEANING METHOD USING THE SAME

(71) Applicant: NISSAN CHEMICAL INDUSTRIES, LTD., Tokyo (JP)

(72) Inventors: Suguru Sassa, Toyama (JP); Shuhei Shigaki, Toyama (JP)

(73) Assignee: NISSAN CHEMICAL INDUSTRIES, LTD., Tokyo (JP)

( * ) Notice: Subject to any disclaimer, the term of this patent is extended or adjusted under 35 U.S.C. 154(b) by 0 days.

(21) Appl. No.: 14/415,844

(22) PCT Filed: Jul. 8, 2013

(86) PCT No.: PCT/JP2013/068644
§ 371 (c)(1),
(2) Date: Jan. 20, 2015

(87) PCT Pub. No.: WO2014/013902
PCT Pub. Date: Jan. 23, 2014

(65) Prior Publication Data
US 2015/0166941 A1  Jun. 18, 2015

(30) Foreign Application Priority Data
Jul. 19, 2012  (JP) .................................. 2012-160884

(51) Int. Cl.
| H01L 21/31 | (2006.01) |
| H01L 21/02 | (2006.01) |
| C11D 11/00 | (2006.01) |
| H01L 21/67 | (2006.01) |
| C11D 3/04 | (2006.01) |
| C11D 3/43 | (2006.01) |
| C11D 7/08 | (2006.01) |
| C11D 7/50 | (2006.01) |
| C11D 3/20 | (2006.01) |

(52) U.S. Cl.
CPC .......... *C11D 11/0041* (2013.01); *C11D 3/042* (2013.01); *C11D 3/2044* (2013.01); *C11D 3/2068* (2013.01); *C11D 3/2096* (2013.01); *C11D 3/43* (2013.01); *C11D 7/08* (2013.01); *C11D 7/5004* (2013.01); *C11D 11/0047* (2013.01); *H01L 21/0206* (2013.01); *H01L 21/31* (2013.01); *H01L 21/6704* (2013.01)

(58) Field of Classification Search
CPC ............. H01L 21/0206; H01L 21/6704; C11D 11/0047
USPC .......................................... 438/778; 510/109
See application file for complete search history.

(56) References Cited

U.S. PATENT DOCUMENTS

| 6,440,856 B1* | 8/2002 | Bessho | B08B 3/08 438/624 |
| 2002/0059943 A1* | 5/2002 | Inagaki | B08B 3/08 134/18 |
| 2006/0016785 A1* | 1/2006 | Egbe | G03F 7/425 216/83 |
| 2006/0040838 A1* | 2/2006 | Shimada | C11D 3/042 510/175 |
| 2007/0051700 A1 | 3/2007 | Lee et al. | |
| 2007/0295366 A1* | 12/2007 | Tomita | C11D 7/08 134/30 |
| 2009/0029893 A1 | 1/2009 | Koshiyama et al. | |
| 2011/0056511 A1* | 3/2011 | Koshiyama | C11D 1/667 134/1 |
| 2011/0088722 A1* | 4/2011 | Geissler | B08B 3/08 134/12 |
| 2012/0021965 A1* | 1/2012 | Bastigkeit | C11D 3/3418 510/393 |
| 2012/0056137 A1* | 3/2012 | Yoon | B82Y 30/00 252/519.3 |
| 2013/0186764 A1* | 7/2013 | Feng | C23G 1/103 205/210 |

FOREIGN PATENT DOCUMENTS

| CN | 1426452 A | 6/2003 |
| CN | 102548654 A | 7/2012 |

(Continued)

OTHER PUBLICATIONS

Sep. 24, 2013 Written Opinon issued in International Application No. PCT/JP2013/068644.
Sep. 24, 2013 International Search Report issued in International Application No. PCT/JP2013/068644.
Apr. 7, 2016 Office Action issued in European Patent Application No. 13820182.7.

(Continued)

*Primary Examiner* — Moazzam Hossain
(74) *Attorney, Agent, or Firm* — Oliff PLC

(57) ABSTRACT

There is provided a cleaning fluid that effectively removes metal impurities and the like existing on a portion through which a chemical solution for lithography passes, before causing the chemical solution to pass through a semiconductor manufacturing equipment in a lithography process, in order to prevent defects caused by the metal impurities and the like found on a semiconductor substrate after forming a resist pattern or after processing a semiconductor substrate in a process for manufacturing semiconductor device. A cleaning fluid to clean a portion through which a chemical solution for lithography passes in a semiconductor manufacturing equipment used in a lithography process for manufacturing semiconductors, including: an inorganic acid; water; and a hydrophilic organic solvent. In the cleaning fluid, the concentration of the inorganic acid is preferably 0.0001% by mass to 60% by mass based on a total mass of the cleaning fluid.

19 Claims, No Drawings

(56) References Cited

FOREIGN PATENT DOCUMENTS

| | | |
|---|---|---|
| EP | 0 560 324 | 9/1993 |
| JP | H05217988 A | 8/1993 |
| JP | H0731810 A | 2/1995 |
| JP | H10256210 A | 9/1998 |
| JP | 3287074 B2 | 5/2002 |
| JP | 2003171692 A | 6/2003 |
| JP | 2004104029 A | 4/2004 |
| JP | 2007123775 A | 5/2007 |
| JP | 2007123776 A | 5/2007 |
| JP | 2007160206 A | 6/2007 |
| JP | 2007165866 A | 6/2007 |
| JP | 2007227645 A | 9/2007 |
| JP | 2007256710 A | 10/2007 |
| JP | 2008216843 A | 9/2008 |
| JP | 4191162 B2 | 12/2008 |
| JP | 2009105299 A | 5/2009 |
| WO | 2005040324 A1 | 5/2005 |

OTHER PUBLICATIONS

Jul. 15, 2016 Office Action issued in Chinese Patent Application No. 201380035843.9.
Aug. 23, 2017 Office Action issued in Chinese Patent Application No. 201380035843.9.

* cited by examiner

CLEANING FLUID FOR SEMICONDUCTOR, AND CLEANING METHOD USING THE SAME

TECHNICAL FIELD

The present invention relates to a cleaning fluid for semiconductors used in a lithography process for manufacturing semiconductor device, particularly to a cleaning fluid to clean a portion of a semiconductor manufacturing equipment through which a chemical solution for lithography passes (a pipe or a filter for filtration in a semiconductor manufacturing equipment), and to a cleaning method using the cleaning fluid.

BACKGROUND ART

In the manufacture of semiconductor device, processing with lithography utilizing resists has been conventionally performed. This processing includes: forming a resist film on a semiconductor substrate such as a silicon wafer; irradiating the substrate with active light such as ultraviolet through a mask pattern having a pattern of the semiconductor device; and developing the substrate to obtain a resist pattern. The substrate is treated by etching with the obtained resist pattern as a protection film, so that concavities and convexities corresponding to the pattern are formed on the surface of the substrate.

In recent years, semiconductor devices become finer, and thus a wavelength of active light to be used becomes shorter from KrF excimer lasers (248 nm) to ArF excimer lasers (193 nm) and EUV light (13.5 nm). Accordingly, various effects such as the reflection of active light from a semiconductor substrate impede proper formations of resist patterns, disadvantageously.

To overcome such a disadvantage, a method is mainly used in which an underlayer film including an organic material, such as an anti-reflective coating and a flattening film, that is, an organic underlayer film, is formed between a semiconductor substrate and a resist. In this case, a portion of the organic underlayer film which is not protected with a resist is removed by etching with a resist pattern as a protection film, and then the semiconductor substrate is processed. Etching for processing organic underlayer films and semiconductor substrates is usually dry etching.

As an underlayer film between a semiconductor substrate and a photoresist, a hardmask that is known as a film including an inorganic material has been used. In this case, a photo resist (organic material) and a hardmask (underlayer film: inorganic material) are significantly different for their components, and thus, the rate of removal by dry etching largely depends on gas species used for dry etching. Therefore, a semiconductor substrate can be processed by utilizing the different etching rates. Generally, the processing of a semiconductor substrate is conducted by dry etching.

A multilayer resist process has also been developed, in which an organic underlayer film is formed as the underlayer of a hardmask by an application method, a CVD method, or the like, and dependency of the dry etching rates of a hardmask and an organic underlayer film on gas species is utilized.

The ArF liquid immersion lithography method has been also developed to lower the cost in the manufacture of semiconductors. In this method, a liquid medium such as water or a dedicated high refractive index liquid with specific thickness is placed between exposure light and a resist, so that the difference between refractive indices allows the ArF light to be further finer to form a pattern, and thus the processing method by using an ArF excimer laser is long-lasting. An inert gas such as air and nitrogen has been conventionally used as an exposure light passing space. In the liquid immersion lithography method, however, the exposure light passing space is substituted with a liquid medium having a refractive index (n) that is larger than the refractive index of such a space (gas), but smaller than the refractive index of a resist film. This method is advantageous because similarly to when exposure light having a shorter wavelength or a high NA lens is used, high resolution is achieved and a focal depth range is not decreased even when a light source having the same exposure wavelength is used. If the liquid immersion lithography is used, a resist pattern having high resolution and an excellent focal depth can be formed at lower cost by using a lens installed on a current exposure device.

ArF liquid immersion lithography is conducted such that a liquid such as water is directly brought into contact with a resist when the resist is exposed. Accordingly, a resist top protection film (top coating) for a liquid immersion process may be used on the resist, in order to prevent defects caused by elution of a foreign substance from the resist.

In a fine lithography process used for manufacturing semiconductor device in large scale, in particular, in a liquid immersion lithography by using an ArF excimer laser, a finer resist pattern is produced, and a specific step in which a liquid medium is directly brought into contact with the resist during exposure is employed. Thus, micro defects that have not conventionally been detected, and defects (watermark) caused by bubble contained in the chemical solution for lithography (A) (a resist, an organic resist underlayer film, a hardmask, a top coating, a developing solution, and the like) have been observed.

Semiconductor manufacturing apparatus used in a lithography process for manufacturing semiconductors include a coater (coating device) for coating a semiconductor substrate with the chemical solution for lithography (A), a developer (development device), and the like. When the chemical solution for lithography (A) is supplied to such devices, it is supplied via a supply system for the chemical solution for lithography (A), which is sealed from an external environment (clean room atmosphere). Usually, the chemical solution for lithography (A) is delivered as sealed. After the sealed chemical solution for lithography (A) is opened in a clean room, it is placed in a supply line for supplying the chemical solution for lithography (A) to a device, so that a contamination of impurities is avoided. The chemical solution for lithography (A) placed in the supply line is not brought into contact with an external environment (clean room atmosphere) until the chemical solution for lithography (A) is supplied on a semiconductor substrate (wafer) located in a coater. Usually, a plurality of filters to filtrate the chemical solution for lithography (A) is placed in a pipe which the chemical solution for lithography (A) passes through until the chemical solution for lithography (A) is applied onto the semiconductor substrate. Accordingly, the chemical solution for lithography (A) supplied to the semiconductor substrate passes through these filters to remove impurities (metals and particles), and then is applied onto the semiconductor substrate. Thus, the chemical solution for lithography (A) which passed through the filters for filtration is expected to contain no impurities. However, despite the careful handling as described above, a defect that may be derived from the applied chemical solution for lithography (A), presence of metal impurities in particular, is found on the semiconductor substrate onto which the chemical solution for lithography (A) is applied. These metal impurities existing on the surface of the semiconductor substrate may result in a defect after etching (cone defect) caused by the metal that becomes a mask when etching the semiconductor substrate, or may result in a defect (watermark) caused by bubble derived from the metal impurities contained. For manufacturing semiconductor device, these defects result in low yield of semiconductor device with good quality, and thus this issue needs to be solved as soon as possible.

The inventors of the present invention have made various investigations on the defects described above, and found that the metal impurities are not derived from the chemical solution for lithography (A) itself, but eluted from the filter to filtrate the chemical solution for lithography (A), which is one of the causes of the defects. One of the causes of the presence of metal impurities may be that a metal-containing catalyst used for manufacturing a resin that is a base material of the filter remains. Examples of the filter base material (resin) used in a filter to filtrate the chemical solution for lithography (A) include fluorine resins such as PTFE (polytetrafluoroethylene) and PFA (tetrafluoroethylene-perfluoroalkyl vinyl ether copolymer), PE (polyethylene), UPE (ultra-high molecular weight polyethylene), PP (polypropylene), PSF (polysulfone), PES (polyethersulfone), and nylon. To synthesize these resins, a metal-containing catalyst such as a metal catalyst including titanium chloride and an organic aluminum compound or magnesium chloride, which is called the Ziegler-Natta catalyst; and a metal catalyst including a chromium compound such as chromium oxide, which is typified by the Phillips catalyst, is commonly used. Thus, metals derived from these catalysts may be one of the causes of the metal impurities.

Recently, the diameter of the pore (the size of the pore) of a filter to filtrate the chemical solution for lithography (A) becomes ultra-fine and is approximately from 30 nm to 2 nm.

To solve the problem of a defect found on the semiconductor substrate, a cleaning fluid that efficiently removes and cleans metal impurities and the like in a portion of a semiconductor manufacturing apparatus, in which the chemical solution for lithography (A) passes through the portion, is needed to be developed.

To date, examples of a cleaning fluid for manufacturing semiconductors include (1) universal cleaning fluid, (2) cleaning fluid for semiconductor substrates, (3) cleaning fluid for filters to filtrate a cleaning fluid, and the like.

Examples of (1) include: a cleaning fluid for lithography characterized by comprising at least one organic solvent selected from ketone organic solvents, lactone organic solvents, alkoxy benzenes, and aromatic alcohols (Patent Document 1); and a cleaning fluid for lithography comprising at least one organic solvent selected from glycol organic solvents, lactone organic solvents, alkoxy benzenes, and aromatic alcohols (Patent Document 2), which have been applied for patents. The cleaning fluids of these applications are characterized by being highly applicable to a plurality of cleaning steps, such as a step for removing an unnecessary chemical solution on the rear surface or the end of a substrate, or removing whole coating after the coating is formed on a base material; and a step for cleaning the base material before a coating material is applied thereon.

Examples of (2) include: a cleaning fluid containing (I) organic acid, (II) surfactant, and (III) inorganic acid (Patent Document 3); a cleaning agent for substrates comprising [I] an organic acid having at least one carboxyl group and/or [II] a complexing agent, [III] an organic solvent selected from the group consisting of (1) monovalent alcohols, (2) alkoxy alcohols, (3) glycols, (4) glycol ethers, (5) ketones, and (6) nitriles (Patent Document 4); a cleaning agent for manufacturing semiconductor devices, containing a fluorine compound and a glycol ether organic solvent (Patent Document 5); and a cleaning agent for semiconductor circuits comprising a carboxylic acid and a water-soluble organic solvent (Patent Document 6), which have been applied for patents. However, these cleaning fluids are designed to clean semiconductor substrates.

Examples of (3) include an 1% by weight hydrogen fluoride solution and an 1% by weight hydrochloric acid solution used as cleaning fluids in a method for desorbing metal ions chemically adsorbed on a filter by using an acidic chemical solution, in which the method is designed to clean a filter to filtrate a cleaning fluid used in a step for cleaning a semiconductor substrate (Patent Document 7), which has been applied for a patent. The portion for which a filter is used, which is described in Patent Document 7, is not the same as the portion through which the chemical solution for lithography (A) passes, which is the purpose of the present invention, but it relates to a filter for the portion through which a fluid to clean a substrate passes. The invention described in Patent Document 7 thus differs from the present invention.

As described above, the cleaning fluids described in any of the documents above have not been developed for removing metal impurities in the portion through which the chemical solution for lithography (A) passes. Thus, the cleaning fluids described in any of the documents above do not meet the purpose of the present invention, and effects thereof are unknown.

PRIOR ART DOCUMENTS

Patent Documents

Patent Document 1: Japanese Patent Application Publication No. 2007-227645 (JP 2007-227645 A)
Patent Document 2: Japanese Patent Application Publication No. 2007-256710 (JP 2007-256710 A)
Patent Document 3: Japanese Patent Application Publication No. 2009-105299 (JP 2009-105299 A)
Patent Document 4: WO 2005/040324 pamphlet
Patent Document 5: Japanese Patent Application Publication No. 2003-171692 (JP 2003-171692 A)
Patent Document 6: Japanese Patent Application Publication No. H10-256210 (JP H 10-256210 A)
Patent Document 7: Japanese Patent Application Publication No. H7-31810 (JP H 7-31810 A)

SUMMARY OF THE INVENTION

Problem to be Solved by the Invention

An object of the present invention is to provide a cleaning fluid that effectively removes metal impurities and the like existing on a portion of a semiconductor manufacturing equipment used in a lithography process, in which a fluid passes through the portion (a pipe for the chemical solution for lithography (A) or a filter to filtrate the chemical solution for lithography (A) in the semiconductor manufacturing apparatus). The cleaning fluid is used in a lithography process, before causing the chemical solution for lithography (A), such as a resist, an organic resist underlayer film, a hardmask, a top coating, and a developing solution, to pass through a semiconductor manufacturing apparatus, in order to prevent defects caused by metal impurities and the like found on a semiconductor substrate after forming a resist pattern or after processing a semiconductor substrate in a process for manufacturing semiconductor device. By cleaning a portion through which the chemical solution for lithography (A) passes with a cleaning fluid of the present invention, metal impurities in the portion can be removed to reduce the defects. Thus, it can be expected that yield of semiconductor devices with good quality is improved, and the cost of preparing devices in a step for manufacturing semiconductors is lowered.

Means for Solving the Problem

The present invention has been devised in view of the circumstances of above. As a result of intensive study, the inventors of the present invention found that a specific cleaning fluid, specifically, a cleaning fluid obtained by mixing an inorganic acid, water, and a hydrophilic organic solvent can effectively remove metal impurities existing on the portion through which a fluid passes, and whereby the present invention has been completed.

The present invention provides: as a first aspect, a cleaning fluid to clean a portion through which a chemical solution for lithography passes in a semiconductor manufacturing equipment used in a lithography process for manufacturing semiconductors, the cleaning fluid comprising: an inorganic acid; water; and a hydrophilic organic solvent;

as a second aspect, the cleaning fluid according to the first aspect, in which concentrations of components of the cleaning fluid are 0.0001% by mass to 60% by mass for the inorganic acid,
0.0006% by mass to 60% by mass for water, and
20% by mass to 99.999% by mass for the hydrophilic organic solvent, based on a total mass of the cleaning fluid;

as a third aspect, the cleaning fluid according to the first aspect or the second aspect, in which the portion through which the chemical solution for lithography passes is a pipe or a filter for filtration in the semiconductor manufacturing apparatus;

as a fourth aspect, the cleaning fluid according to any one of the first aspect to the third aspect, in which the inorganic acid is sulfuric acid, hydrochloric acid, or nitric acid.

as a fifth aspect, the cleaning fluid according to any one of the first aspect to the fourth aspect, in which the hydrophilic organic solvent is a glycol solvent or a lactone solvent;

as a sixth aspect, the cleaning fluid according to any one of the first aspect to the fifth aspect, in which the hydrophilic organic solvent is 1-methoxy-2-propanol or 1-ethoxy-2-propanol;

as a seventh aspect, the cleaning fluid according to any one of the first aspect to the sixth aspect, further comprising: a surfactant;

as an eighth aspect, the cleaning fluid according to any one of the first aspect to the seventh aspect, further comprising: a metal scavenger (a chelate compound);

as a ninth aspect, a cleaning method comprising: causing the cleaning fluid as described in any one of the first aspect to the eighth aspect to pass through the portion through which the chemical solution for lithography passes in the semiconductor manufacturing apparatus used in the lithography process;

as a tenth aspect, a semiconductor device formed by a semiconductor manufacturing equipment used in a lithography process, in which the device is cleaned with the cleaning fluid as described in any one of the first aspect to the eighth aspect; and as an eleventh aspect, a method for manufacturing a semiconductor device, comprising: processing a semiconductor substrate by using a resist pattern that is used for manufacturing the semiconductor device and is formed by a semiconductor manufacturing equipment used in a lithography process, in which the device is cleaned with the cleaning fluid as described in any one of the first aspect to the eighth aspect.

Effects of the Invention

The present invention provides a cleaning fluid and a cleaning method using the cleaning fluid for effectively cleaning a portion of a semiconductor manufacturing apparatus used in a lithography process for manufacturing semiconductor device, in which a fluid passes through the portion (a pipe for the chemical solution for lithography (A) or a filter to filtrate the chemical solution for lithography (A) in the semiconductor manufacturing apparatus).

The cleaning fluid (C) of the present invention is a mixture of the hydrophilic organic solvent (B) (preferably, a glycol organic solvent or a lactone organic solvent alone, or a mixed solution of two or more of them) and an aqueous solution of an inorganic acid, as well as water if necessary. For effective removal of metal impurities, the cleaning fluid (C) preferably contains 0.0001% by mass to 60% by mass of an inorganic acid component based on the total mass of the cleaning fluid (C).

The main purpose of the cleaning fluid (C) of the present invention is removal of metal impurities. The cleaning fluid (C) of the present invention is used for a variety of pipes and microfilters for filtration in a semiconductor manufacturing apparatus used in a lithography process, such as a coater (coating device) and a developer (development device), in which the chemical solution for lithography (A) passes through the pipes and microfilters. The cleaning fluid (C) of the present invention can be used at the time of pretreatment before causing the chemical solution for lithography (A) to pass through the pipes and microfilters, or at the time of exchanging the chemical solution for lithography (A) (changing to another chemical solution for lithography (A) to pass through). In other words, the pipe, the filter to filtrate the chemical solution for lithography (A), or a pipe in which the pipe and the filter are combined is cleaned by causing the cleaning fluid (C) to pass through it, and then is further cleaned by causing the hydrophilic organic solvent (B) to pass through it until all acidic components contained in the cleaning fluid are removed, and thus metal impurities existing in the pipe and the filter can be removed. As a result, the defect derived from metal impurities in a lithography process can be reduced.

Specifically, bubble is produced if compatibilities and incompatibilities of substances dissolved in the chemical solution for lithography (A) are unbalanced, and the production of bubble caused by the metal impurities can be suppressed by removing hydrophobic metal impurities with the cleaning fluid (C) of the present invention. Thus, defects of a resist pattern produced after the lithography process, or defects (watermark) caused by the bubble after dry etching can be avoided. Further, metal impurities existing on the surface of the semiconductor substrate may result in a defect after etching (cone defect) caused by the metal that becomes a mask when etching the semiconductor substrate. This defect after etching (cone defect) can also be avoided.

MODES FOR CARRYING OUT THE INVENTION

Hereinafter, the present invention will be described in detail. The present invention is the cleaning fluid (C) that is manufactured by mixing an inorganic acid, water, and the hydrophilic organic solvent (B). The cleaning fluid (C) is intended to clean a portion of a semiconductor manufacturing apparatus used in a lithography process for manufacturing semiconductors, in which the chemical solution for lithography (A), such as a resist, an organic resist underlayer film, a hardmask, a top coating, and a developing solution passes through the portion.

An example of a method for preparing the cleaning fluid (C) includes adding the hydrophilic organic solvent (B), as well as water if necessary, to an aqueous solution of an inorganic acid. If necessary, a surfactant and a metal scavenger (chelate compound) may further be added.

A method for preparing the cleaning fluid (C) will be specifically described below. A hydrophilic organic solvent and an aqueous solution of an inorganic acid are placed in a polyethylene container whose inside has been sufficiently cleaned with water or the like, so that no metal components exist inside of the container, and water is further added if necessary. The content is mixed (stirred) by using a shaker stirrer, a magnetic stirrer, or the like at room temperature for 0.5 hour to 10 hours to prepare the cleaning fluid (C). When preparing the cleaning fluid (C) in a large scale (several kg to several tons), similarly to above, the components of the cleaning fluid (C) are placed in a chemical solution mixing tank made of a resin such as polyethylene of a given capacity or a stainless mixing tank with fluorine resin lining of a given capacity, whose inside (a fluid contact portion) has been sufficiently cleaned with water or the like, and then the content is mixed by using a mixing impeller or the like to prepare the cleaning fluid (C). Alternatively, in order to accurately prepare the concentration of an inorganic acid component and the like, a concentration larger than that as calculated is used for initial preparation, and then an accurate concentration of the inorganic acid is determined with a method such as neutralization titration, and finally the concentration is prepared by adding an organic solvent (or water) to the content, and mixed (stirred) to prepare the cleaning fluid of an aimed concentration. In order to remove micro impurities (particles) in the prepared cleaning fluid (C), the cleaning fluid may be filtrated with, for example, a polyethylene microfilter (pore size: e.g., 0.05 μm).

The inorganic acid contained in the cleaning fluid (C) allows the cleaning fluid to become acidic, so that metal impurities deposited on a pipe for the chemical solution for lithography (A) and on the filter to filtrate the chemical solution for lithography (A) in a semiconductor manufacturing apparatus are ionized to be easily eluted in the cleaning fluid, and to be cleaned. Examples of the inorganic acid include hydrochloric acid, nitric acid, phosphoric acid, sulfuric acid, boric acid, and hydrofluoric acid, and among them, sulfuric acid, hydrochloric acid, and nitric acid are effective in removing metal impurities. In particular, sulfuric acid, hydrochloric acid, and nitric acid are effective in eluting magnesium, aluminum, potassium, calcium, iron, chromium, and the like deposited on the filter to filtrate the chemical solution for lithography (A).

A percentage of an inorganic acid contained in the cleaning fluid (C) of the present invention is 0.0001% by mass to 60% by mass or 0.001% by mass to 40% by mass, and preferably 0.001% by mass to 1% by mass, based on the total mass of the cleaning fluid (C). If the concentration of the inorganic acid is 0%, metals are not eluted when cleaning a portion through which a chemical solution passes (a pipe or a member), and if it is 60% by mass or more, a portion through which a chemical solution passes (a pipe or a member) is corroded. Also, depending on types of inorganic acids (for example, sulfuric acid), viscosity of the solution increases, which hinders, in the cleaning step, the cleaning fluid itself from circulating in a pipe.

A concentration of water contained in the cleaning fluid (C) of the present invention is 0.0006% by mass to 60% by mass or 0.006% by mass to 40% by mass, and preferably 0.0006% by mass to 10% by mass, based on the total mass of the cleaning fluid (C). In order to ionize metal impurities, at least 0.0006% by mass or more of water needs to be mixed. If the concentration of water is 60% by mass or more, a portion of a semiconductor manufacturing apparatus through which a chemical solution passes is not sufficiently substituted with the hydrophilic organic solvent (B), after the portion is cleaned with the cleaning fluid (C). Moreover, there is high possibility that water remains in a pipe, and such water may disturb performance of the chemical solution for lithography (A) used in a fine lithography process for manufacturing semiconductors.

A concentration of the hydrophilic organic solvent (B) contained in the cleaning fluid (C) of the present invention is 20% by mass to 99.999% by mass, and preferably 90% by mass to 99.999% by mass, based on the total mass of the cleaning fluid (C).

The hydrophilic organic solvent (B) is an organic solvent miscible in any proportions with water, and the mixed state is required to be stably maintained without a phase separation. The hydrophilic organic solvent (B) is used as a medium that accounts for a high concentration in the cleaning fluid (C), and it also dissolves a metal-containing catalyst, which is used for manufacturing the filter to filtrate the chemical solution for lithography (A), and still remains in a finished product of the filter, so that metal impurities contained in the filter for filtration can be removed.

After cleaning a pipe by using the cleaning fluid (C) of the present invention, the cleaning fluid (C) remaining in the pipe needs to be substituted only with the hydrophilic organic solvent (B) not containing any inorganic acids. However, in a common step for manufacturing semiconductor device, the chemical solution for lithography (A) is caused to pass through the pipe immediately after the hydrophilic organic solvent (B) is passed through. This is to enhance throughput of the manufacturing line of semiconductor device. Usually, there is no step for drying the inside of a pipe, and thus a glycol organic solvent or a lactone organic solvent, which is used as a universal solvent for the chemical solution for lithography (A), is preferable as the hydrophilic organic solvent (B) used in the cleaning fluid (C) of the present invention, Examples of the glycol organic solvent include ethylene glycol, diethylene glycol, triethylene glycol, propylene glycol, diethylene glycol monomethyl ether, triethylene glycol monomethyl ether, propylene glycol monomethyl ether, propylene glycol monoethyl ether, 3-methoxy-3-methyl-1-butanol, ethylene glycol monomethyl ether acetate, propylene glycol monomethyl ether acetate, diethylene glycol monobutyl ether acetate, and diethylene glycol monoethyl ether acetate.

Examples of the lactone organic solvent include γ-butyrolactone, α-methyl-γ-butyrolactone, γ-valerolactone, γ-caprolactone, γ-laurolactone, δ-valerolactone, and hexanolactone.

Among them, 1-methoxy-2-propanol (propylene glycol monomethyl ether) or 1-ethoxy-2-propanol (propylene glycol monoethyl ether) is particularly preferable as the hydrophilic organic solvent (B) of the cleaning fluid (C) of the present invention, In order to enhance an affinity to the fluid contact portion of the pipe, a surfactant may be added to the cleaning fluid (C) of the present invention, if necessary. Examples of the surfactant include nonionic surfactants including polyoxyethylene alkylethers, such as polyoxyethylene lauryl ether, polyoxyethylene stearyl ether, polyoxyethylene cetyl ether, and polyoxyethylene oleyl ether; polyoxyethylene alkylarylethers, such as polyoxyethylene octyl phenol ether and polyoxyethylene nonyl phenol ether; polyoxyethylene-polyoxypropylene block copolymers; sorbitan fatty acid esters, such as sorbitan monolaurate, sorbitan monopalmitate, sorbitan monostearate, sorbitan monooleate, sorbitan trioleate, and sorbitan tristearate; and polyoxyethylene sorbitan fatty acid esters, such as polyoxyethylene sorbitan monolaurate, polyoxyethylene sorbitan monopalmitate, polyoxyethylene sorbitan monostearate, polyoxyethylene sorbitan trioleate, and polyoxyethylene sorbitan tristearate; fluorine surfactants including Eftop EF301, EF303, and EF352 (manufactured by Tohkem Products Co., Ltd.), MEGAFAC F171 and F173 (manufactured by Dainippon Ink and Chemicals, Incorporated), Fluorad FC430 and FC431 (manufactured by Sumitomo 3M Limited), AsahiGuard AG710, SURFLON S-382, SC101, SC102, SC103, SC104, SC105, and SC106 (manufactured by Asahi Glass Co., Ltd.), and Ftergent series (manufactured by NEOS Company Limited); and organosiloxane polymer KP341 (manufactured by Shin-Etsu Chemical Co., Ltd.). A mixed amount of the surfactant is usually with a concentration of not more than 1.0% by mass, preferably not more than 0.1% by mass of the total 100% by mass of the cleaning fluid (C) of the present invention. These surfactants may be added alone, or two or more surfactants may be added in combination.

In order to improve trapping of metal impurities, a metal scavenger (chelate compound) may be added. Specific examples of the metal scavenger as a chain coordination-type chelator include ethylenediamines, such as ethylenediamine, diethylenetriamine, triethylenetetramine, tetraethylenepentamine, and pentaethylenehexamine; bipyridines, such as 2,2'-bipyridine and 4,4'-bipyridine; dicarboxylic acid compounds, such as ethylenediaminetetraacetic acid, succinic acid, glutaric acid, adipic acid, pimelic acid, suberic acid, azelaic acid, sebacic acid, phthalic acid, isophthalic acid, and terephthalic acid; and phenanthroline.

Examples of a cyclic coordination-type chelator include porphyrins; and crown ethers, such as phthalocyanine, corrole, chlorin, 12-crown-4, 15-crown-5, 18-crown-6, dibenzo-18-crown-6, and diaza-18-crown-6. A mixed amount of the metal scavenger (chelate compound) is usually with a concentration of not more than 10% by mass, preferably not more than 5% by mass of the total 100% by mass of the cleaning fluid (C) of the present invention. These metal scavengers (chelate compounds) may be added alone, or two or more metal scavengers may be added in combination.

The cleaning fluid (C) of the present invention composed as described above is caused to pass through a pipe for the chemical solution for lithography (A) before the chemical solution for lithography (A) is caused to pass through a semiconductor manufacturing apparatus, and whereby metal impurities causing defects on a semiconductor substrate can be removed. The cleaning fluid (C) is caused to pass through the pipe for the chemical solution for lithography (A) once or multiple times in a circulation step. After that, the cleaning fluid (C) remaining in the pipe is substituted only with the hydrophilic organic solvent (B) obtained by removing an aqueous solution of an inorganic acid from the cleaning fluid (C). After an inorganic acid component is removed in the pipe, the chemical solution for lithography (A) is caused to pass through the pipe.

After that, spin coating, baking, exposure, and developing treatment are conducted to a semiconductor substrate under a specific condition to form a desired resist pattern.

Further, a ground substrate is processed by an etching method by using the resist pattern as a mask to obtain the desired pattern of a semiconductor substrate. A dry etching method is preferably used as the etching method. Then, a trace, an insulating film, and the like are repeatedly formed on the pattern to form a desired semiconductor device.

EXAMPLES

Hereinafter, the present invention will be described according to examples; however, the present invention is not limited to these examples.

Preparation of Cleaning Fluid

Synthesis Example 1

3,600 g of purified 1-ethoxy-2-propanol (propylene glycol monoethyl ether (PGEE)) (manufactured by Tokyo Chemical Industry Co., Ltd.), 0.4 g of a 98% by mass aqueous solution of sulfuric acid (manufactured by Nissan Chemical Industries, Ltd.), and 399.6 g of water were added into a 4 L polyethylene container (manufactured by AICELLO CHEMICAL CO., LTD.) whose inside was sufficiently washed with water to remove metal impurities and the like, and the container was sealed. The container was sufficiently shaken and stirred at room temperature to obtain a 0.01% by mass sulfuric acid-containing cleaning fluid (a concentration of an organic solvent: 90.0% by mass, and a concentration of water: 9.99% by mass).

Synthesis Example 2

20.0 g of purified PGEE (manufactured by Tokyo Chemical Industry Co., Ltd), 40.8 g of a 98% by mass aqueous solution of sulfuric acid (manufactured by Nissan Chemical Industries, Ltd.), and 39.2 g of water were added into a 250 mL polyethylene container (manufactured by AICELLO CHEMICAL CO., LTD.) whose inside was sufficiently washed with water to remove metal impurities and the like, and the container was sealed. The container was sufficiently shaken and stirred at room temperature to obtain a 40% by mass sulfuric acid-containing cleaning fluid (a concentration of an organic solvent: 20.0% by mass, and a concentration of water: 40.0% by mass), Synthesis Example 3

10 g of the 0.01% by mass sulfuric acid-containing cleaning fluid obtained in Synthesis Example 1 and 90 g of purified PGEE (manufactured by Tokyo Chemical Industry Co., Ltd.) were added into a 250 mL polyethylene container (manufactured by AICELLO CHEMICAL CO., LTD.) whose inside was sufficiently washed with water to remove metal impurities and the like, to obtain a 0.001% by mass sulfuric acid-containing cleaning fluid (a concentration of an organic solvent: 99.0% by mass, and a concentration of water: 0.999% by mass).

Synthesis Example 4

99.99 g of purified PGEE (manufactured by Tokyo Chemical Industry Co., Ltd.) and 0.01 g of a 36.46% by mass aqueous solution of hydrochloric acid (manufactured by Kanto Chemical Co., Inc.) were added into a 250 mL polyethylene container (manufactured by AICELLO CHEMICAL CO., LTD.) whose inside was sufficiently washed with water to remove metal impurities and the like, and the container was sealed. The container was sufficiently shaken and stirred at room temperature to obtain a 0.003646% by mass hydrochloric acid-containing cleaning fluid (a concentration of an organic solvent: 99.99% by mass, and a concentration of water: 0.006354% by mass).

Synthesis Example 5

99.9 g of purified PGEE (manufactured by Tokyo Chemical Industry Co., Ltd.) and 0.1 g of a 36.46% by mass aqueous solution of hydrochloric acid (manufactured by Kanto Chemical Co., Inc.) were added into a 250 mL polyethylene container (manufactured by AICELLO CHEMICAL CO., LTD.) whose inside was sufficiently washed with water to remove metal impurities and the like, and the container was sealed. The container was sufficiently shaken and stirred at room temperature to obtain a 0.03646% by mass hydrochloric acid-containing cleaning fluid (a concentration of an organic solvent: 99.9% by mass, and a concentration of water: 0.06354% by mass).

Synthesis Example 6

99.616 g of purified PGEE (manufactured by Tokyo Chemical Industry Co., Ltd.) and 0.384 g of a 36.46% by mass aqueous solution of hydrochloric acid (manufactured by Kanto Chemical Co., Inc.) were added into a 250 mL polyethylene container (manufactured by AICELLO CHEMICAL CO., LTD.) whose inside was sufficiently washed with water to remove metal impurities and the like, and the container was sealed. The container was sufficiently shaken and stirred at room temperature to obtain a 0.14% by mass hydrochloric acid-containing cleaning fluid (a concentration of an organic solvent: 99.616% by mass, and a concentration of water: 0.244% by mass).

Synthesis Example 7

99.973 g of purified 1-methoxy-2-propanol (propylene glycol monomethyl ether (PGME)) (manufactured by Tokyo Chemical Industry Co., Ltd.) and 0.027 g of a 36.46% by mass aqueous solution of hydrochloric acid (manufactured by Kanto Chemical Co., Inc.) were added into a 250 mL polyethylene container (manufactured by AICELLO CHEMICAL CO., LTD.) whose inside was sufficiently washed with water to remove metal impurities and the like, and the container was sealed. The container was sufficiently shaken and stirred at room temperature to obtain a 0.01% by mass hydrochloric acid-containing cleaning fluid (a concentration of an organic solvent: 99.973% by mass, and a concentration of water: 0.017% by mass).

Example 1

Test for Metal Impurity Elution from Portion Through which Chemical Solution Passes by Cleaning Fluid Circulation A solvent (PGEE) or the cleaning fluid of Synthesis Example 1 was circulated 9 times (corresponding to approximately 36 L) in a circulating filtration device composed of a fluorine resin (PTFE) pipe for a chemical solution (an inner diameter/an outer diameter: 4 mm/6 mm, and a total length: approximately 2 m) used as a pipe in a semiconductor manufacturing apparatus; a filter to filtrate a chemical solution (commercial product); and a circulation pump. After circulation, the cleaning fluid was diluted by a factor of 10 with purified PGEE (manufactured by Tokyo Chemical Industry Co., Ltd.), and the metal content thereof was analyzed by using the ICP-MS (Agilent7500, manufactured by Agilent Technologies, Inc.). Table 1 shows the results of the analyses.

TABLE 1

| | Metal Content (ppb) | | | | |
|---|---|---|---|---|---|
| | Mg | K | Al | Ca | Fe |
| Synthesis Example 1 | 9.1 | 1.7 | 10.4 | 8.0 | 1.0 or less |
| PGEE | 1.6 | 1.0 or less | 1.0 or less | 1.1 | 1.0 or less |

Example 2

Test for Metal Impurity Elution from Member Including Portion Through which Chemical Solution for Semiconductor Passes Six pieces of a resin for a chemical solution contact member existing in a pipe of a semiconductor manufacturing apparatus (commercial product, made of polyethylene, and containing Mg, K, Al, Ca, and Fe as impurities) were cut out with ceramic scissors, in which one piece is approximately 0.3 g. Each of the resin pieces was placed in a 250 mL polyethylene bottle that contains each of the cleaning fluids synthesized in each of Synthesis Example 2 to Synthesis Example 6 or water, and the bottles were left stationary at room temperature for one week to immerse the resin pieces. After that, each of the immersion fluids was diluted by a factor of 10 with purified PGEE (manufactured by Tokyo Chemical Industry Co., Ltd.), and the metal content thereof was analyzed by using the ICP-MS (Agilent7500, manufactured by Agilent Technologies, Inc.). Table 2 shows the results of the analyses.

TABLE 2

| | Metal Content (ppb) | | | | |
|---|---|---|---|---|---|
| | Mg | K | Al | Ca | Fe |
| Synthesis Example 2 | 17.0 | 8.4 | 12.0 | 30.1 | 1.0 or less |
| Synthesis Example 3 | 5.4 | 2.8 | 7.7 | 9.2 | 1.0 or less |
| Synthesis Example 4 | 8.5 | 2.2 | 10.7 | 8.7 | 7.2 |
| Synthesis Example 5 | 11.5 | 2.5 | 12.3 | 10.0 | 6.0 |
| Synthesis Example 6 | 2.7 | 7.0 | 3.1 | 35.2 | 20.0 |
| Water | 1.0 or less | 1.0 or less | 1.0 or less | 1.0 or less | 1.0 or less |

INDUSTRIAL APPLICABILITY

The present invention provides a cleaning fluid that is manufactured by mixing an inorganic acid, water, and a hydrophilic organic solvent. The cleaning fluid is intended to clean a portion of a semiconductor manufacturing apparatus used in a lithography process for manufacturing semiconductors, in which the chemical solution for lithography passes through the portion. By causing the cleaning fluid to pass through the portion of a cleaning device through which a chemical solution passes (a pipe for a chemical solution or a filter to filtrate a chemical solution in a semiconductor manufacturing apparatus), metal impurities causing defects in a lithography process of manufacturing semiconductor devices can be removed, and thus yield of semiconductor devices with good quality is improved, and the cost reduction is expected.

The invention claimed is:

1. A cleaning fluid for cleaning a portion through which a chemical solution for lithography passes in a semiconductor manufacturing equipment used in a lithography process for manufacturing semiconductors, the cleaning fluid comprising:
   0.0001% by mass to 60% by mass of an inorganic acid;
   0.0006% by mass to 60% by mass of water; and
   20% by mass to 99.999% by mass of a hydrophilic organic solvent,
   based on a total mass of the cleaning fluid, wherein the inorganic acid is sulfuric acid or hydrochloric acid, and the portion through which the chemical solution for lithography passes is a pipe or a filter for filtration in the semiconductor manufacturing equipment.

2. The cleaning fluid according to claim 1, wherein
   the hydrophilic organic solvent is a glycol solvent or a lactone solvent.

3. The cleaning fluid according to claim 1, wherein
   the hydrophilic organic solvent is 1-methoxy-2-propanol or 1-ethoxy-2-propanol.

4. The cleaning fluid according to claim 1, further comprising:
   a surfactant.

5. The cleaning fluid according to claim 1, further comprising:
   a metal scavenger (a chelate compound).

6. A cleaning method comprising:
   causing the cleaning fluid as claimed in claim 1 to pass through the portion through which the chemical solution for lithography passes in the semiconductor manufacturing equipment used in the lithography process.

7. A semiconductor device formed by a semiconductor manufacturing equipment used in a lithography process, wherein the device is cleaned with the cleaning fluid as claimed in claim 1.

8. A method for manufacturing a semiconductor device, the method comprising:
   processing a semiconductor substrate by using a resist pattern that is used for manufacturing the semiconductor device and is formed by a semiconductor manufacturing equipment used in a lithography process, wherein the device is cleaned with the cleaning fluid as claimed in claim 1.

9. The cleaning fluid according to claim 1, wherein
   the cleaning fluid comprises 90% by mass to 99.999% by mass of the hydrophilic organic solvent,
   based on the total mass of the cleaning fluid.

10. A cleaning fluid for cleaning a portion through which a chemical solution for lithography passes in a semiconductor manufacturing equipment used in a lithography process for manufacturing semiconductors, the cleaning fluid comprising:
    0.001% by mass to 1% by mass of an inorganic acid;
    0.0006% by mass to 10% by mass of water; and
    90% by mass to 99.999% by mass of a hydrophilic organic solvent,
    based on a total mass of the cleaning fluid.

11. A cleaning fluid for cleaning a portion through which a chemical solution for lithography passes in a semiconductor manufacturing equipment used in a lithography process for manufacturing semiconductors, the cleaning fluid comprising:
    0.001% by mass to 1% by mass of an inorganic acid;
    0.0006% by mass to 60% by mass of water; and
    20% by mass to 99.999% by mass of a hydrophilic organic solvent,
    based on the total mass of the cleaning fluid.

12. The cleaning fluid according to claim 11, wherein the inorganic acid is sulfuric acid, hydrochloric acid, or nitric acid.

13. The cleaning fluid according to claim 11, wherein the hydrophilic organic solvent is a glycol solvent or a lactone solvent.

14. The cleaning fluid according to claim 11, wherein
    the hydrophilic organic solvent is 1-methoxy-2-propanol or 1-ethoxy-2-propanol.

15. The cleaning fluid according to claim 11, further comprising:
    a surfactant.

16. The cleaning fluid according to claim 11, further comprising:
    a metal scavenger (a chelate compound).

17. A cleaning method comprising:
    causing the cleaning fluid as claimed in claim 11 to pass through the portion through which the chemical solution for lithography passes in the semiconductor manufacturing equipment used in the lithography process.

18. A semiconductor device formed by a semiconductor manufacturing equipment used in a lithography process, wherein the device is cleaned with the cleaning fluid as claimed in claim 11.

19. A method for manufacturing a semiconductor device, the method comprising:
    processing a semiconductor substrate by using a resist pattern that is used for manufacturing the semiconductor device and is formed by a semiconductor manufacturing equipment used in a lithography process, wherein the device is cleaned with the cleaning fluid as claimed in claim 11.

\* \* \* \* \*